(12) United States Patent
Li et al.

(10) Patent No.: US 9,105,525 B2
(45) Date of Patent: Aug. 11, 2015

(54) TOUCH UNIT, ARRAY SUBSTRATE, LIQUID CRYSTAL CELL SUBSTRATE AND TOUCH DISPLAY DEVICE

(71) Applicant: BEIJING BOE OPTOELECTRONICS TECHNOLOGY CO., LTD., Beijing (CN)

(72) Inventors: Cheng Li, Beijing (CN); Xiaokun Li, Beijing (CN); Dong Chen, Beijing (CN); Yang Pei, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 69 days.

(21) Appl. No.: 14/123,664

(22) PCT Filed: Oct. 30, 2012

(86) PCT No.: PCT/CN2012/083772
§ 371 (c)(1),
(2) Date: Dec. 3, 2013

(87) PCT Pub. No.: WO2013/177896
PCT Pub. Date: Dec. 5, 2013

(65) Prior Publication Data
US 2015/0171119 A1   Jun. 18, 2015

(30) Foreign Application Priority Data

May 28, 2012   (CN) .......................... 2012 1 0169808

(51) Int. Cl.
*G06F 3/041* (2006.01)
*H01L 27/12* (2006.01)
(Continued)

(52) U.S. Cl.
CPC ........ *H01L 27/1255* (2013.01); *G02F 1/13338* (2013.01); *G06F 3/041* (2013.01); *G06F 3/044* (2013.01); *H01L 27/124* (2013.01)

(58) Field of Classification Search
CPC .................................. G06F 3/041; G06F 3/044
USPC .................................................. 345/173, 174
See application file for complete search history.

(56) References Cited

U.S. PATENT DOCUMENTS

2009/0278810 A1* 11/2009 Ma et al. ........................ 345/173
2010/0060600 A1   3/2010 Wang et al.
(Continued)

FOREIGN PATENT DOCUMENTS

CN   101666931 A   12/2011
CN   102707858 A   10/2012

OTHER PUBLICATIONS

International Search Report Issued Feb. 27, 2013, Appln. PCT/CN2012/083772.
(Continued)

*Primary Examiner* — David Vu
*Assistant Examiner* — Brandon Fox
(74) *Attorney, Agent, or Firm* — Ladas & Parry LLP

(57) ABSTRACT

The embodiment of the present invention discloses a touch unit, an array substrate, a liquid crystal cell substrate and a touch display device. The touch unit comprise a plurality of touch sub-units, each of which comprising a sensor thin film transistor (TFT), an sensing capacitor, a reading induction line and a memory capacitor, the capacitance of the memory capacitor being less than that of the sensing capacitor. Due to the memory capacitor is added to stabilize the voltage of the sensor TFT, the interference of noise upon the voltage of the sensor TFT is reduced, thus effectively improving the signal stability of the touch unit.

8 Claims, 1 Drawing Sheet

(51) Int. Cl.
  *G02F 1/1333* (2006.01)
  *G06F 3/044* (2006.01)

(56) References Cited

U.S. PATENT DOCUMENTS

2011/0069020 A1* 3/2011 Kim et al. .................... 345/173
2012/0139866 A1* 6/2012 Jung et al. .................... 345/174

OTHER PUBLICATIONS

First Chinese Office Action dated Sep. 2, 2014; Appln. No. 201210169808.3.

International Preliminary Report on Patentability Appln. No. PCT/CN2012/083772; Dated Dec. 2, 2014.

* cited by examiner

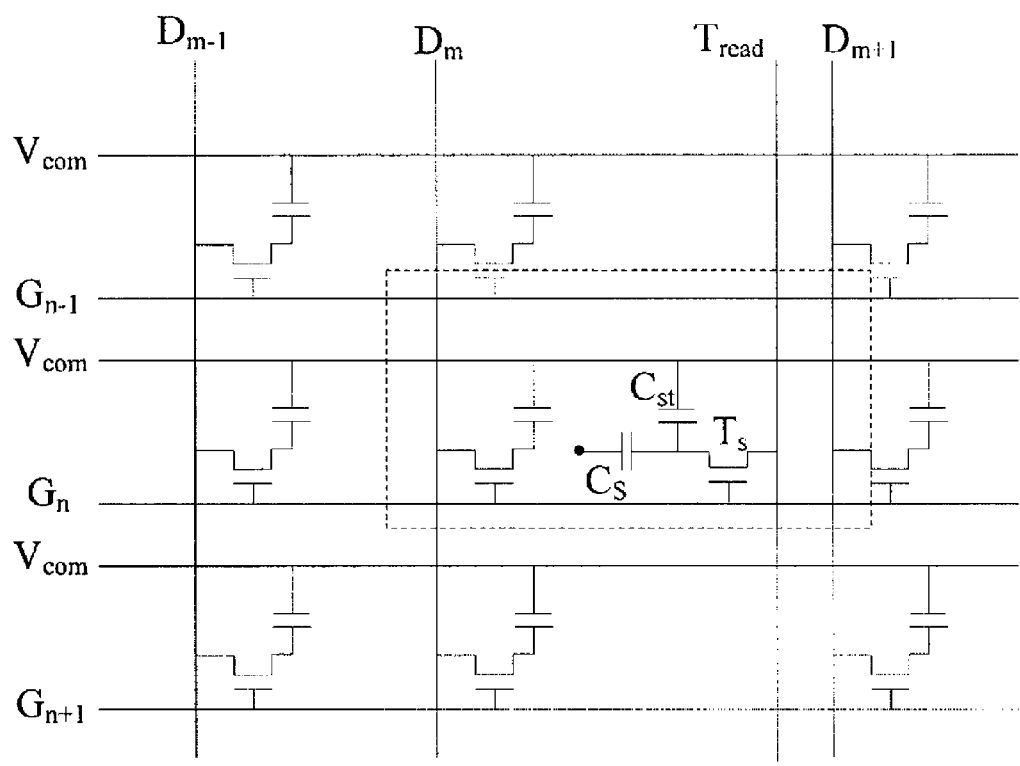

TOUCH UNIT, ARRAY SUBSTRATE, LIQUID CRYSTAL CELL SUBSTRATE AND TOUCH DISPLAY DEVICE

TECHNICAL FIELD

The embodiments of the present invention disclose a touch unit, an array substrate, a liquid crystal cell substrate and a touch display device.

BACKGROUND

An in-cell touch liquid crystal display device is made by incorporating touch units into the top side substrate of a liquid crystal display device, i.e., into the thin film transistor (TFT) array substrate.

The operating principle for a capacitive in-cell touch liquid crystal display device is that, because the touch capacitance of touch units is changed by touch, the touch units will convert the change of the touch capacitance to the change of voltage and transmit the change to an external signal processing unit via a reading induction line. Therefore, the external signal processing unit can detect this change of voltage and thus obtain the position of touch.

In an existing in-cell touch liquid crystal display device, the stability for signals of touch units is poor.

SUMMARY

The embodiments of the present invention provide a touch unit, an array substrate, a liquid crystal cell substrate and a touch display device, so as to overcome the problem of poor signal stability occurring in existing touch units.

One aspect of the present invention provides a touch unit, comprising: a plurality of touch sub-unit, each of which comprising a sensor thin film transistor (TFT), an sensing capacitor, a reading induction line and a memory capacitor, the capacitance of the memory capacitor being less than that of the sensing capacitor; a gate electrode of the sensor TFT is connected with a gate line of the array substrate; one of source and drain electrodes of the sensor TFT is connected with the reading induction line; one end of the sensing capacitor is connected with the other one of the source and drain electrodes of the sensor TFT; one end of the memory capacitor is connected with the other one of the source and drain electrodes of the sensor TFT, and the other end being connected with a voltage stabilizing electrode.

Another aspect of the present invention provides an array substrate comprising the above touch unit.

Still another aspect of the present invention provides a liquid crystal cell substrate comprising the above touch unit.

Yet another aspect of the present invention provides a touch display device comprising the above liquid crystal cell substrate.

In an embodiment of the present invention, due to the memory capacitor is incorporated to stabilize the voltage of the sensor TFT; the interference of noise upon the voltage of the sensor TFT is reduced, thus effectively improving the signal stability of the touch unit. Further, the sensor TFT in the touch unit shares the gate electrode of the array substrate, simplifying the configuration of the circuit and thus reducing the manufacturing costs for components.

BRIEF DESCRIPTION OF THE DRAWINGS

In order to illustrate the technical solution of the embodiment of the present invention more clearly, a simple introduction about the drawings of the embodiments will be made in the following, and obviously, the drawings described later relate to only some embodiments of the present invention, rather than limitation to the present invention.

FIG. 1 is a schematic view of the circuit structure of a touch unit according to an embodiment of the present invention.

DETAILED DESCRIPTION

To make clearer the object, technical solutions and advantages of the embodiments of the present invention, a clear and full description of the technical solution of the embodiment of the present invention will be made with reference to the accompanying drawings of the embodiment of the present invention. Obviously, the described embodiments are merely part of the embodiments of the present invention, but not all the embodiments. Based on the described embodiments of the present invention, all the other embodiments acquired by the ordinary skilled in this art, without any creative labor, fall into the protective scope of the present invention.

Unless defined otherwise, the technical or scientific terminologies being used should take the meaning usually understood by the ordinary skilled in this art of the present invention. The words "first", "second" as well as similar words used in the patent application specification and claims of the present invention do not mean any sequence, quantity or importance, but are only used to distinguish different components. Also, "a" or "an" and similar words do not mean quantitative restriction, but refer to the existence of at least one. "Connect" or "joint" and the similar words are not limited to physical or mechanical connections, but may comprise electrical connection, no matter directly or indirectly. And further, the words "upper", "lower", "left", "right" etc are used only for describing a relative positional relationship, which will also be varied correspondingly when the described objects are changed in its absolute position.

An embodiment of the present invention provides a touch unit comprising a plurality of touch sub-units, each of which comprises a sensor TFT, a sensing capacitor, a reading induction line and a memory capacitor.

The above memory capacitor has capacitance less than that of the above sensing capacitor, so as to ensure that, when the magnitude of the capacitance of the sensing capacitor changes, a voltage jump of the sensor TFT can be caused accordingly and thereby touch addressing is achieved.

The connection relationship among the various devices may be that: the gate electrode of the sensor TFT is connected with an gate line of the array substrate; the drain electrode of the sensor TFT is connected with the reading induction line; one end of the sensing capacitor is connected with the source electrode of the sensor TFT; one end of the memory capacitor is connected with the source electrode of the sensor TFT, and the other end being connected with a voltage stabilizing electrode.

Due to the drain electrode and the source electrode of a TFT is exchangeable, the connection relationship among the various devices also may be: the gate electrode of the sensor TFT is connected with the gate line of the array substrate; the source electrode of the sensor TFT is connected with the reading induction line; one end of the sensing capacitor is connected with the drain electrode of the sensor TFT; one end of the memory capacitor is connected with the drain electrode of the sensor TFT, and the other end connected with the voltage stabilizing electrode.

One end of the memory capacitor is connected with the source electrode or the drain of the sensor TFT, and the other end is connected with the voltage stabilizing electrode. The voltage stabilizing electrode can be a common electrode of the array substrate, or a common electrode of the color filter substrate, or other electrodes capable of providing a stabilized voltage. Therefore, when no variation occurs for the sensing capacitor, the memory capacitor can maintain a stabilized voltage of the sensor TFT and thus suppress influence of noise upon the voltage signals of the sensor TFT.

Due to the memory capacitor is increased to regulate the voltage of the sensor TFT, the interference of noise upon the voltage of the sensor TFT is reduced, thus effectively improving the signal stability of the touch unit. Furthermore, the sensor TFT in the touch unit shares the gate electrodes of the array substrate, simplifying the configuration of the circuit and thus reducing the manufacturing costs for the components.

In an embodiment of the present invention, the intersection of the adjacent gate lines and adjacent data lines of the array substrate corresponds to one pixel area.

In the touch unit provided by an embodiment of the present invention, the arrangement of the touch sub-units may be that one pixel area is correspondingly provided along with one touch sub-unit.

Alternatively, in order to reduce manufacturing costs and simplify circuit structure, the arrangement of the touch sub-units may also be that several pixel areas are provided along with one touch sub-unit. The amount of the pixel areas correspondingly provided for one touch sub-unit can be determined according to actual touch sensing area, the aperture ratio of pixels and etc. For example, if the actual touch sensing area is larger, one touch sub-unit may be provided correspondingly for more pixel areas, and otherwise, one touch sub-unit may be provided correspondingly for less pixel areas. If the aperture ratio for the pixels is high, one touch sub-unit may be provided correspondingly for more pixel areas, and otherwise, one touch sub-unit may be provided correspondingly for less pixel areas.

A detailed description of the touch unit provided by the embodiment of the present invention will be given in conjunction with the drawings.

FIG. 1 is a schematic view of the circuit structure of an array substrate integrated with the touch unit according to an embodiment of the present invention. In the drawing, $G_{n-1}$, $G_n$ and $G_{n+1}$ represent gate scanning lines (i.e., gate lines) of the array substrate; $D_{m-1}$, $D_m$ and $D_{m+1}$ represent data lines of the array substrate; $V_{com}$ represents the common electrode (line) on the array substrate, and TS represents a sensor TFT; $C_S$ represents a sensing capacitor, the magnitude of the capacitance of which can be varied according to the touch on the surface of the touch display device; $C_{st}$ represents a memory capacitor; $T_{read}$ represents a reading induction line arranged to be parallel to the data line. The capacitance of the memory capacitor $C_{st}$ is less than that of the sensing capacitor $C_S$.

The intersection of adjacent gate lines and adjacent data lines corresponds to one pixel area. For example, the adjacent two gate lines and adjacent two data lines within the broken-line frame of FIG. 1 are intersected to form an area corresponding to one pixel area. The pixel TFT and the sensor TFT of the array substrate share one gate line of the array substrate. In FIG. 1, one pixel area is provided with one touch sub-unit, and the gate electrode of the sensor TFT $T_S$ of this touch sub-unit is connected with the gate line $G_n$ of the array substrate. In addition, the drain electrode of the sensor TFT $T_S$ is connected with the reading induction line $T_{read}$, one end of the sensing capacitor is connected to the source electrode of the sensor TFT $T_S$, and one end of the memory capacitor $C_{st}$ is connected with the source electrode of the sensor TFT $T_S$, while the other end is connected to the common electrode of the array substrate; or, the source electrode of the sensor TFT $T_S$ is connected with the reading induction line $T_{read}$, one end of the sensing capacitor $C_S$ is connected with the drain electrode of the sensor TFT $T_S$; and one end of the memory capacitor $C_{st}$ is connected with the drain electrode of the sensor TFT $T_S$, the other end is connected with the common electrode of the array substrate.

It should be noted that, in FIG. 1, only the touch sub-unit provided correspondingly for one pixel area is illustrated while the touch sub-units provided correspondingly for other pixel areas are not illustrated in detail.

It should also be noted that FIG. 1 only illustrates such a situation where the gate electrode of the sensor TFT $T_S$ is connected with the gate line $G_n$ of the array substrate, and also the gate electrode of the sensor TFT $T_S$ may be connected with the gate line $G_{n-1}$ of the array substrate.

If one touch sub-unit is provided correspondingly for each pixel area of the array substrate, in the touch sub-unit corresponding to one pixel area, which is defined by the intersection of adjacent two gate lines and adjacent two data lines on the array substrate, the gate electrode of the sensor TFT thereof may be connected with either of the adjacent gate lines. FIG. 1 illustrates such a connection relationship as an example.

If one touch sub-unit is provided correspondingly for several pixel areas, then in the touch sub-unit provided for the pixel area corresponding to the intersection of the gate line $G_{n1}$, the gate line $G_n$, the data line $D_{m1}$, and the data line $D_m$, the gate electrode of the sensor TFT thereof is connected with either of the gate lines $G_{n1}$ to $G_n$. The gate line $G_{n1}$ and the gate line $G_n$ are gate lines that are not adjacent in their locations, and the data line $D_{m1}$ and the data line $D_m$ are data lines that are not adjacent in their locations. The number of the gate lines between the Gate line $G_{n1}$ and the gate line $G_n$ is identical to or different from the number of the data lines between the data line $D_{m1}$ and the data line $D_m$.

For example, in FIG. 1, one touch sub-unit is provided for the corresponding pixel areas between the gate lines $G_{n-1}$, $G_{n+1}$, $D_{m-1}$, $D_{m+1}$, thus the connection way of this touch sub-unit can be that shown in FIG. 1.

When the touch display device is in operation, the gate lines are scanned in a certain period, and turn on the sensor TFTs $T_S$ on the various gate lines line by line. Due to the presence of the memory capacitor $C_{st}$, the reading induction line $T_{read}$ receives steady voltage signal $V_1$ when the sensor TFT $T_S$ is turned on by the corresponding gate line. When touch on the surface of the touch display device causes capacitance variation of the sensing capacitor $C_S$, the voltage at one end of the sensor TFT $T_S$ connected with the sensing capacitor $C_S$ changes abruptly to $V_2$, and by this time, the reading induction line $T_{read}$ receives this jump signal, such that the touch generating position can be obtained by the external signal processing unit, thus achieving the function of touch addressing.

An embodiment of the present invention also provides an array substrate comprising the touch unit provided by either of the above embodiments. The array substrate comprises an array structure which may be, but not limited to, a TFT array substrate.

An embodiment of the present invention also provides a liquid crystal cell substrate which has a configuration comprising the touch unit provided by either of the above embodiments. The liquid crystal cell substrate for example is a color filter substrate or the like. For example, this liquid crystal cell substrate may be arranged opposing to the array substrate or COA (the Color filter on Array) so as to form a liquid crystal cell. Due to the COA substrate forms the array structure as well as the color filter configuration onto a same substrate; the liquid crystal cell substrate corresponding thereto may not need to be formed with the color filter configuration.

An embodiment of the present invention also provides a touch display device which has a configuration comprising the array substrate or the liquid crystal cell substrate provided by either of the above embodiments.

Specifically, the touch unit provided by the embodiment of the present invention may be an in-cell touch unit.

Specifically, the touch display device provided by the embodiment of the present invention may be an in-cell touch liquid crystal display device.

Apparently, various modification and alternation to the present invention can be made by the skilled on in this art without departing from the spirit and scope of the present invention. Thereby, the present invention intends to encompass all such modification and alternation, provided they are within the scope of the claims of the present invention and its equivalents.

The invention claimed is:

1. A touch unit, comprising:
    a plurality of touch sub-units, each of which comprising a sensor thin film transistor (TFT), an sensing capacitor, a reading induction line and a memory capacitor, capacitance of the memory capacitor being less than that of the sensing capacitor;
    a gate electrode of the sensor TFT being connected with a gate line of the array substrate;
    one of source and drain electrodes of the sensor TFT being connected with the reading induction line;
    one end of the sensing capacitor being connected with the other one of the source and drain electrodes of the sensor TFT; and
    one end of the memory capacitor being connected with the other one of the source and drain electrodes of the sensor TFT, and the other end being connected with a voltage stabilizing electrode.

2. The touch unit according to claim 1, wherein intersection of adjacent gate lines and adjacent data lines of the array substrate corresponds to one pixel area, and one pixel area is correspondingly provided with one touch sub-unit.

3. The touch unit according to claim 1, wherein in the touch sub-unit provided for the pixel area corresponding to intersection of a gate line $G_{n-1}$, a gate line $G_n$, a data line $D_m$, and a data line $D_{m+1}$, the gate electrode of the sensor TFT of the touch sub-unit is connected with the gate line $G_{n-1}$ or $G_n$.

4. The touch unit according to claim 1, wherein intersection of adjacent gate lines and adjacent data lines of the array substrate corresponds to one pixel area, and several pixel areas are correspondingly provided with one touch sub-unit.

5. The touch unit according to claim 4, wherein in the touch sub-unit provided for the pixel area corresponding to intersection of a gate line $G_{n-1}$, a gate line $G_n$, a data line $D_m$, and a data line $D_{m+1}$, the gate electrode of the sensor TFT thereof is connected with any one of the gate lines $G_{n1}$ to $G_n$; and
    the gate line $G_{n1}$ and the gate line $G_n$ are gate lines that are not adjacent in their locations, and the data line $D_{m1}$ and the data line $D_m$ are data lines that are not adjacent in their locations.

6. The touch unit according to claim 1, wherein the voltage stabilizing electrode is a common electrode on the array substrate, or a common electrode on the color filter substrate.

7. An array substrate comprising the touch unit according to claim 1.

8. A touch display device comprising the array substrate according to claim 7.

* * * * *